US006884463B2

(12) United States Patent
Kitada et al.

(10) Patent No.: US 6,884,463 B2
(45) Date of Patent: Apr. 26, 2005

(54) CVD PROCESS FOR FORMING A THIN FILM

(75) Inventors: Katsutsugu Kitada, Kanagawa (JP); Masayuki Saito, Kanagawa (JP)

(73) Assignee: Tanaka Kikinzoku Kogyo K.K., Tokyo (JP)

( * ) Notice: Subject to any disclaimer, the term of this patent is extended or adjusted under 35 U.S.C. 154(b) by 590 days.

(21) Appl. No.: 09/817,122

(22) Filed: Mar. 27, 2001

(65) Prior Publication Data

US 2001/0036509 A1 Nov. 1, 2001

(30) Foreign Application Priority Data

Mar. 31, 2000 (JP) ........................................ 2000-096359
Aug. 10, 2000 (JP) ........................................ 2000-242108

(51) Int. Cl.$^7$ .............................................. C23C 16/56
(52) U.S. Cl. .................... 427/248.1; 427/252; 427/345; 427/352
(58) Field of Search ............................. 427/248.1, 252, 427/345, 352

(56) References Cited

U.S. PATENT DOCUMENTS 3,356,527 A * 12/1967 Moshier et al. ............. 427/253
5,144,049 A * 9/1992 Norman et al. ............... 556/12

OTHER PUBLICATIONS

Hawley's Condensed Chemical Dictionary, 11$^{th}$ Edition, 1987, p. 1080.*

* cited by examiner

Primary Examiner—Timothy Meeks
(74) Attorney, Agent, or Firm—Rothwell Figg Ernst & Manbeck

(57) ABSTRACT

The present invention is a CVD process for forming a thin film which includes a step of recovering an organometallic compound component from an exhaust gas which has been conventionally discarded, and a purifying step of purifying the recovered organometallic compound to thereby eliminate a by-product formed in a film forming step by CVD. According to this process, the organometallic compound is recycled. As a recovering technique, any of the followings is employed: a technique in which the exhaust gas is cooled and is recovered as a recovered content; a technique in which the exhaust gas is brought into contact with a solvent to dissolve the organometallic compound in the solvent; and a technique in which the exhaust gas is brought into contact with an adsorbent to thereby adsorb the organometallic compound. A purifying technique is selected depending on the recovering technique or the properties of the recovered content, and any of a technique of distilling the recovered content, a technique of sublimating the recovered content, and a technique of heating the adsorbent to desorb the organometallic compound is employed. These CVD thin film processes can recover and purify the organometallic compound in a higher yield by adding a step of eliminating oxygen from the exhaust gas prior to the recovering step.

58 Claims, 3 Drawing Sheets

CVD PROCESS FOR FORMING A THIN FILM

BACKGROUND OF THE INVENTION

1. Technical Field of the Invention

The present invention relates to a CVD process for producing a thin film, in which a thin film composed of a metal or metal oxide is produced by a CVD process using an organometallic compound as a material.

2. Description of the Related Art

A chemical vapor deposition process (herein after referred to as "CVD process") is one of techniques for the formation of a thin film generally used in the production of a thin film electrode of semiconductor apparatus, since the CVD process can advantageously produce a uniform film and is excellent in step coverage. On an increasing demand for further increasing the packaging density of circuits and electronic members in recent years, it is expected that the CVD process which can meet this requirement goes mainstream of processes for producing a thin film electrode in the future.

This CVD process is a process for producing a thin film of a metal or metal oxide by (1) a step of vaporizing a metallic compound material to yield a source gas, and (2) a step of transporting the source gas to a surface of a substrate, allowing particles of the transported material to react on the substrate to yield a metal or metal oxide, and depositing the metal or metal oxide to yield a thin film. As the metallic compound material, an organometallic compound which has a low melting point and is easy to handle is particularly used.

It is assumed that a cost for the production of a thin film by the CVD process depends on a cost of a material organometallic compound and on a ratio of the amount of organometallic compound introduced onto a surface of a substrate to the amount of the organometallic compound consumed through a reaction, that is, on utilization efficiency. Utilization efficiency in conventional CVD processes is as low as 10% or less, and most of the introduced source gas is actually treated as an exhaust gas and the organometallic compound in the exhaust gas is discarded even if the organometallic compound is in an unreacted state. Accordingly, the production cost of a thin film in such a case that the utilization efficiency is low is strongly affected by the cost of the organometallic compound under present circumstances.

However, such an organometallic compound is generally expensive as it requires a multiplicity of steps for synthesis. For example, even when the metal itself is not so expensive such as in copper, the cost significantly increases when the metal is synthetically converted into an organometallic compound. It is speculated that the production cost of a thin film by a conventional CVD process inevitably increases due to the price of the expensive organometallic compound.

Additionally, a thin film of a precious metal such as ruthenium or iridium is recently applied as a material for a thin film electrode to thereby yield a high-performance electrode. An organometallic compound of a precious metal is expected to be heavily used as a material for this purpose in the future. A precious metal is naturally a rare metal and is expensive, and its organic compound is significantly expensive. Accordingly, when a precious metal thin film is produced by a conventional CVD process, a cost for forming a film is expected to further increase.

In addition, the organometallic compound has a low melting point and is easy to handle as described above, and the use of the organometallic compound can decrease a vaporization temperature and a reaction temperature (a substrate temperature) and can efficiently produce a thin film, and is expected to be increased more than ever in the future. Even when the organometallic compound grows in demand, however, the conventional CVD process having a low utilization efficiency invites a great quantity of loss in material, and there is apprehension of resource starvation.

Accordingly, an object of the present invention is to provide a CVD process for a thin film which is low in loss of a material organometallic compound and which can reduce a production cost of a thin film when compared with a conventional CVD process for a thin film, as wall as a CVD apparatus for producing a thin film which can produce a thin film without loss of organometallic compound.

SUMMARY OF THE INVENTION

The present inventors made investigations on conventional general CVD thin film processes and on methods for reducing a film-formation cost. As a possible solution to this, the present inventors initially came up with the idea of improving utilization efficiency, but considered that this is not a practical measure, since the utilization efficiency cannot be actually 100%, although the utilization efficiency can be improved to some extent by film-formation conditions and apparatus configuration. The present inventors therefore came to a conclusion that a process in which an organometallic compound component is recovered and recycled from an exhaust gas is a process having the greatest promise. Such an exhaust gas has been conventionally discarded. Additionally, they found that a step of purifying the organometallic compound is further required, in which a reaction product is separated and eliminated from the recovered organometallic compound component, since a reaction product (a decomposition product) formed through a reaction of a source gas is introduced into the exhaust gas in a film-forming step by CVD. The present invention has been accomplished based on these findings and concepts.

Then, based on the above concepts, the present inventors made intensive investigations on processes for recovering an organometallic compound from an exhaust gas, and have accomplished a process for forming a thin film based on the following three recycling processes.

A first aspect of the present application is a CVD process for forming a thin film, which includes a vaporizing step of heating and vaporizing an organometallic compound to yield a source gas; a thin film forming step of introducing the source gas onto a substrate and allowing the source gas to react on a surface of the substrate to yield a thin film of a metal or metal oxide; a recovering step of cooling an exhaust gas containing a reaction product formed in the thin film forming step and an unreacted source gas to condense or solidify the unreacted source gas to thereby yield a recovered content containing a liquid or solid organometallic compound; and a purifying step of separating and purifying the organometallic compound from the recovered content.

The present invention utilizes a phenomenon that an organometallic compound has a low melting point and invites phase change at relatively low temperatures. In this process, an exhaust gas is cooled to introduce phase change of the organometallic compound in a gaseous state into a solid state or liquid state to thereby recover the organometallic compound, and the recovered organometallic compound is further purified to yield a high purity organometallic compound. The present invention can recover a component containing an unreacted organometallic compound and can extract the organometallic compound in a state which can be recycled. The invention therefore can reduce production cost of a thin film without inviting loss in material, even when the utilization efficiency of the material is low.

Conditions for cooling the exhaust gas in the recovering step are determined by the properties of the organometallic compound used. Specifically, when an organometallic compound which does not sublimate is used, the exhaust gas is cooled below a temperature 30° C. lower than its boiling point. On the other hand, when the used organometallic compound sublimates, the exhaust gas must be cooled below a temperature 30° C. lower than its melting point. A specific mechanism for cooling the exhaust gas and recovering the organometallic compound in the recovering step includes, for example, a configuration in which a cold trap is mounted on piping from the reactor chamber.

Incidentally, the recovered content recovered in the recovering step is considered to be basically composed of an unreacted organometallic compound and a reaction product. Such reaction products which are identified by previous studies include water, carbon dioxide, aldehydes, formic acid, and other low molecular weight compounds. A metal atom is eliminated from the organometallic compound by a reaction for the formation of a thin film, and the organometallic compound is decomposed to thereby yield these low molecular weight compounds. Such water and other reaction products are impurities but can be easily separated and eliminated in the following purification step, as they have physical properties greatly different from those of the target organometallic compound to be purified.

However, after investigations on the properties of an actually recovered content, the present inventors found that the actually recovered content contains oxides or hydroxides of the organometallic compound, and other compounds having molecular weights close to that of the target organometallic compound, in addition to an unreacted organometallic compound and the above water and other reaction products. The compounds mentioned above are formed by the oxidation of the unreacted organometallic compound.

This is presumably because oxygen is generally added as a reaction gas to enhance the decomposition of a relatively stable organometallic compound in a CVD process for forming a thin film using the organometallic compound, and the oxygen reacts with an unreacted organometallic compound during transportation in piping from the thin film forming step to the recovering step or during the recovering step.

If the oxidized unreacted organometallic compound cannot be separated and eliminated in the subsequent purifying step, it adversely affects the purity of the purified organometallic compound. Even if the oxide can be separated and eliminated, it deteriorates the yield of the organometallic compound. Accordingly, oxidation of such an unreacted organometallic compound must be prevented in any case.

The present inventors therefore added a step of eliminating oxygen from the exhaust gas prior to the recovering step, as a technique for preventing the oxidation phenomenon of the unreacted organometallic compound. By this configuration, oxygen is eliminated from the exhaust gas derived from the thin film forming step, and oxidation of the unreacted organometallic compound can be prevented. The technique for eliminating oxygen includes a technique in which the exhaust gas after the thin film forming step is brought into contact with an oxygen adsorbent (e.g., a deoxidizer such as iron powder).

The use of a cold trap as a specific example of the recovering step has been already described. It is more preferred to cool the exhaust gas using a cold trap from which oxygen has been eliminated, in order to more surely prevent oxidation of the unreacted metal oxide. Thus, oxidation of the organometallic compound in the recovered content can be prevented by also eliminating oxygen from the cold trap. A treatment for oxygen elimination in this procedure includes a technique in which the inside of the cold trap has been replaced with an inert gas such as nitrogen or argon.

As a technique for purifying the recovered content obtained in the recovering step to an organometallic compound having such a purity as to be used as a material for a thin film, a process is passably applicable in which the organometallic compound in the recovered content is fired and is once reduced to a metal and is extracted, and the target organometallic compound is then produced again. However, this technique tends to invite loss in metal in the step of reducing and extracting the metal and in the step of converting the metal to an organic compound, resulting in a decreased recovery and an increased cost in regeneration. Particularly, this tendency is strong in iridium and ruthenium among precious metals. When iridium is fired and reduced, it is converted into iridium oxide which has a low reactivity with chemicals and cannot be significantly extracted. Ruthenium is converted into ruthenium tetroxide upon reduction, and the ruthenium tetroxide has a strong sublimating property and sublimates during purification, resulting in loss.

Accordingly, it is preferred to separate the organometallic compound by distillation of the recovered content in the purification step. An organometallic compound having a good purity can be directly separated by distillation, since the organometallic compound has a low melting point and can induce phase change at relatively low temperatures, as described above. Additionally, distillation does not require complex equipment and is a relatively easy purification technique.

On the other hand, some types of organometallic compounds in the recovered content become solids through cooling in the first aspect of the present invention. In this case, such a recovered content in a solid state cannot be significantly recovered, is not suitable for a continuous operation, and cannot be significantly purified by distillation. When the recovered content is solid, therefore, the recovered content is preferably brought into contact with a solvent in which the organometallic compound is soluble to thereby dissolve the organometallic compound in the solvent in the purifying step to yield a liquid. Such a solvent for use herein includes, for example, ethylene glycol. To avoid the aforementioned problem of oxidation of the unreacted organometallic compound, oxygen is preferably eliminated from the solvent in which the organometallic compound is soluble by, for example, a process of bubbling the solvent with an inert gas in the purifying step, prior to contact between the recovered content and the solvent.

When the recovered content is dissolved in the solvent, the dissolved organometallic compound must be converted into a state that can be recycled. Purification utilizing recrystallization is preferred as a purifying step in this case. Specifically, the purifying step preferably includes one of a step of cooling a solvent containing the recovered content to thereby separate the organometallic compound in a solid state and a step of mixing the solvent containing the recovered content with a poor solvent to thereby separate the organometallic compound in a solid state, where the organometallic compound is sparingly soluble in the poor solvent. The poor solvent for use in the latter technique must be soluble in the solvent, as well as the organometallic compound must be sparingly soluble in the poor solvent. Such poor solvents meeting these requirements include, for example, methanol, acetonitrile, and water.

In the purifying step by means of recrystallization, there are cases where a trace amount of a by-product is deposited in recrystallization from a solvent and is introduced into a deposited metal organic as an impurity. As a solution to this problem, the purifying step preferably further includes a step of heating the separated solid organometallic compound to thereby sublimate the organometallic compound or the reaction product. By this configuration, an organometallic compound having a more improved purity can be obtained. In this case, whether a substance to be sublimated is the target organometallic compound or the impurity reaction product depends on vapor pressures (sublimation pressures) of these substances. Accordingly, when the target organometallic compound has a lower vapor pressure, the organometallic compound is purified in a gaseous state. On the contrary, when the reaction product has a lower vapor pressure, the organometallic compound is purified in a solid state as intact.

A second process for forming a thin film presented by the present inventors is a CVD process for forming a thin film, which includes a vaporizing step of heating and vaporizing an organometallic compound to yield a source gas; a thin film forming step of introducing the source gas onto a substrate and allowing the source gas to react on a surface of the substrate to yield a thin film of a metal or metal oxide; a recovering step of bringing an exhaust gas containing a reaction product formed in the thin film forming step and an unreacted source gas into contact with a solvent, in which the organometallic compound is soluble, to dissolve the organometallic compound in the solvent to thereby recover the organometallic compound; and a purifying step of separating and purifying the organometallic compound from the solvent containing the organometallic compound.

The second process for forming a thin film differs from the first process for forming a thin film in that the organometallic compound is directly recovered from an exhaust gas derived from the thin film forming step, and in that the organometallic compound can be recovered without a step of cooling the exhaust gas. Such a solvent for use in the second aspect of the invention includes, for example, diethylene glycol.

There are some cases where an unreacted organometallic compound is oxidized in the second process for forming a thin film, as in the first process for forming a thin film. The second process therefore preferably further comprise a step of eliminating oxygen from the exhaust gas prior to the recovering step. Likewise, oxygen is effectively eliminated from a solvent in which the organometallic compound is soluble prior to contact between the exhaust gas and the solvent.

As in the first process for forming a thin film, the purifying step in the second process for forming a thin film is preferably performed by recrystallization, and preferably includes one of a step of cooling a solvent containing the recovered content to thereby separate the organometallic compound in a solid state and a step of mixing the solvent containing the recovered content with a poor solvent to thereby separate the organometallic compound in a solid state, where the organometallic compound is sparingly soluble in the poor solvent. Such a poor solvent for use in the latter process also includes, for example, methanol, ethanol, and water.

There are some cases where an impurity is contained in the purified organometallic compound also in this process, and the solid organometallic compound is preferably further heated to sublimate the organometallic compound or the reaction product. The state of the purified organometallic compound depends on a relationship between the vapor pressure of the organometallic compound to be purified and the vapor pressure of the impurity.

Additionally, in another embodiment of the purifying step in the second process for forming a thin film, a solvent containing the organometallic compound is subjected to liquid chromatography. The purifying technique has advantages in that it does not require a complex step as compared with the recrystallization technique and that it can extract and purify a high purity organometallic compound by selecting an appropriate filler (column). As the filler of the liquid chromatograph for use in this technique, any of silica gel, octadecylsilane, alumina, porous polymers, graphite carbon, and zeolite can be applied.

A third process for forming a thin film presented by the present inventors is a CVD process for forming a thin film, which includes a vaporizing step of heating and vaporizing an organometallic compound to yield a source gas; a thin film forming step of introducing the source gas onto a substrate and allowing the source gas to react on a surface of the substrate to yield a thin film of a metal or metal oxide; a recovering step of bringing an exhaust gas containing a reaction product formed in the thin film forming step and an unreacted source gas into contact with an adsorbent to adsorb the organometallic compound to thereby recover the organometallic compound; and a purifying step of separating and purifying the organometallic compound from the adsorbent adsorbing the organometallic compound.

As in the second process for forming a thin film, the third process for forming a thin film directly recovers the organometallic compound from an exhaust gas derived from the thin film forming step and can recover the organometallic compound without a step of cooling the exhaust gas.

There are some cases where an unreacted organometallic compound is oxidized in the third process for forming a thin film, as in the first and second processes for forming a thin film. The process therefore preferably further comprise a step of eliminating oxygen from the exhaust gas prior to the recovering step.

Such an adsorbent for adsorbing the organometallic compound includes an activated carbon. As the activated carbon for use herein, one generally used for absorption of a neutral gas is preferred. Additionally, another embodiment of the adsorbent includes a host compound that can include the organometallic compound as a guest. The term "host compound" as used herein means and includes a substance that can house (include) the organometallic compound as a guest in its gap in a given compositional ratio to thereby form a specific crystal structure. Such substances that are applicable as the host compound in the present invention include, for example, cyclodextrin and urea.

As a technique for purifying the recovered organometallic compound in the third process for forming a thin film, the recovered organometallic compound is preferably purified by heating the adsorbent adsorbing the organometallic compound. This utilizes a cycle of adsorptive property (a TS cycle) of the adsorbent due to temperature difference. Specifically, the adsorptive property of the adsorbent increases at low temperatures and decreases at high temperatures when the pressure is held at constant, and the adsorbed organometallic compound can be desorbed by heating the adsorbent after adsorption so that the adsorbent increases in temperature as compared when the adsorbent adsorbs the organometallic compound (in the recovering step). This technique is advantageous in that it is an easy technique. In this connection, adsorptive property of the adsorbent is recovered at low temperatures and the adsorbent after desorption of the organometallic compound can be reused. By cooling the adsorbent after retrieval of the metal oxide in the purifying step, the adsorbent can again adsorb an organometallic compound in the exhaust gas.

When the organometallic compound retrieved by heating of the adsorbent contains an impurity, the organometallic compound must be purified to a further extent. In this case, the purity of the metal oxide can be increased to a purity necessary as a thin film material by subjecting the separated organometallic compound to gas chromatography. As such columns for use in gas chromatography, siloxanes, silica gel, octadecylsilane, alumina, porous polymers, graphite carbon, and zeolite can be applied.

According to the three processes for forming a thin film which include different recovering techniques from each other, the organometallic compound which undergoes the purifying step has characteristics required as a thin film material. It is accepted in the present invention that a thin film is formed in a batch system, and the purified organometallic compound is recycled to the vaporizing step after the completion of one thin film forming step, and film-formation is resumed again. However, mixing of the purified organometallic compound in the purifying step with the organometallic compound or source gas in the vaporizing step allows a continuous operation and can more efficiently form a thin film. When the purified organometallic compound is a solid or liquid, it is mixed with a metal oxide prior to heating in the vaporizing step. When the purified organometallic compound is a gas, it is mixed with a source gas after vaporization.

Organometallic compounds for use in the present invention are not particularly limited. Organic compounds of a variety of metals such as copper, indium, tantalum, tungsten, molybdenum, titanium, and rhenium which are conventionally used as materials for the formation of a thin film can be applied to the invented process for forming a thin film. Some of these metals are inexpensive as metal itself, but organometallic compounds thereof are significantly expensive. The cost in the formation of a thin film of these metals or metal oxides can therefore be reduced.

Additionally, the present invention is particularly useful in the production of a thin film using an organometallic compound of a precious metal such as silver, gold, platinum, palladium, ruthenium, rhodium, iridium, or osmium, in consideration of recently increased demands for a thin film of a precious metal and in consideration of high prices of organic compounds of such precious metals.

Finally, a CVD apparatus for producing a thin film, to which apparatus the invented CVD process for forming a thin film is applied, will be illustrated. The invented CVD process for forming a thin film is performed with an apparatus including devices for a recovering step and a purifying step added to a conventional CVD apparatus for producing a thin film, without major change of its configuration. Specifically, the CVD apparatus for producing a thin film according to the present application is a CVD apparatus for producing a thin film, which includes a solution containing an organometallic compound as a material, a heating device for heating the solution to vaporize the organometallic compound to thereby yield a source gas, and a reactor for allowing the source gas to react to thereby form a thin film of a metal or metal oxide on a substrate. The apparatus includes, on the downstream side from the reactor, a recovering device for obtaining a recovered content containing the organometallic compound from an exhaust gas composed of a reaction product formed through a reaction and an unreacted source gas, and a purifying device for separating and purifying the organometallic compound from the recovered content.

To avoid the above problem of oxidation of an unreacted organometallic compound in the recovered content, the invented CVD apparatus for producing a thin film preferably further includes, between the reactor and the recovering means, an oxygen eliminating device for eliminating oxygen from the exhaust gas. An embodiment of the oxygen eliminating device includes an absorption tank filled with a deoxidizer such as iron powder.

The practical recovering device and purifying device for use in this apparatus depends on the type of the organometallic compound and a recovering technique appropriate thereto. Initially, a cold trap in which the exhaust gas is cooled to yield a recovered content in a liquid state is preferably applied as the recovering device, when the exhaust gas is converted into a liquid. A solvent tank containing a solvent in which the organometallic compound is soluble, or an adsorption tank filled with an adsorbent that can adsorb the organometallic compound is arranged as a recovering device for direct recovery of the organometallic compound from the exhaust gas. In this connection, a solvent tank and an adsorption tank each of which contains or is filled with ethylene glycol or another solvent or an activated carbon, cyclodextrin urea or another adsorbent are applied as the solvent tank and adsorption tank.

Additionally, the purifying means is selected depending on the properties of the recovered content, and a distillation apparatus, an extractor, and a chromatograph (a liquid chromatography are applied when the recovered content is a liquid. Specific distillation apparatus and extractor are not particularly limited, and a variety of apparatus from on a laboratory scale to on an industrial scale can be applied depending on the scale of the CVD apparatus. For example, as the distillation apparatus, a distillation apparatus composed of a distillation flask as a distillation apparatus on a laboratory scale, and a distillation column as a distillation apparatus on an industrial scale can be used. Likewise, the extractor can be selected from separating funnels, mixing tanks (mixer-settlers), parallel-flow mixers (flow mixers), packed columns, pulse columns and other countercurrent extraction columns, depending on the scale of the CVD apparatus.

Furthermore, the apparatus preferably includes a chromatograph (a gas chromatograph) as a purifying device when the exhaust gas is recovered in the adsorption tank. In this case, the purifying step is performed in a gaseous state, and a heating device such as a heater for heating the adsorption tank is added to the adsorption tank in the CVD apparatus for producing a thin film in order to convert the organometallic compound once adsorbed by the adsorbent into a gaseous state.

DESCRIPTION OF THE EMBODIMENTS

First Embodiment

Figure 1:
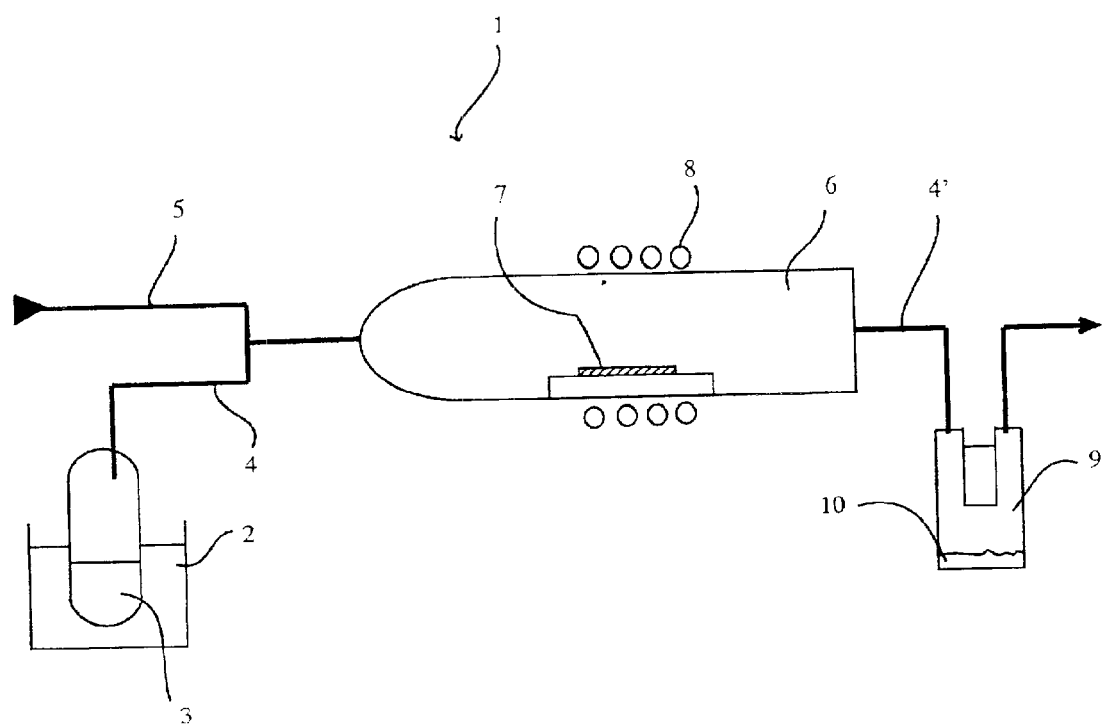
FIG. 1 is a schematic diagram of a CVD apparatus used in first to fourth embodiments.

FIG. 1 is a schematic diagram of CVD apparatus 1 used in the present embodiment. In CVD apparatus 1 of FIG. 1, organometallic compound 3 filled in thermostatic bath 2 is heated and is vaporized in thermostatic bath 2 into source gas 4, and source gas 4 is mixed with oxygen 5 as a carrier gas and is transported onto a surface of substrate 7 in reaction chamber 6. Substrate 7 is heated by high frequency coil 8 to thereby induce a CVD reaction on the surface of the substrate. Cold trap 9 is mounted behind the reaction chamber, through which source gas 4' after reaction passes.

In the present embodiment, 105.55 g of bis(ethylcyclopentadienyl)ruthenium $[(C_2H_5C_5H_4)_2Ru]$ was used as organometallic compound 3. Bis(ethylcyclopentadienyl)ruthenium $[(C_2H_5C_5H_4)_2Ru]$ was heated to 100° C. and was vaporized to form a film. Conditions for thin film formation in this embodiment were as follows.

| | |
|---|---|
| Substrate | Ti-coated Si substrate |
| Substrate temperature | 250° C. |
| Reaction chamber pressure | 666.5 Pa (5.0 Torr) |
| Carrier gas flow rate | 100 mL/min |
| Reaction gas flow rate | 200 mL/min |

A refrigerant was allowed to pass on a cooling surface of cold trap 9 to thereby cool a passing gas to −10° C. A film was then formed until a material ran out, and recovered content 10 in cold trap 9 was collected. At this stage, the recovered content was 86 g and a recovery was calculated as 81.5%.

Recovered content 10 recovered in this step was distilled at 105° C. at 46.7 Pa (0.35 Torr) to recover 70 g of a fraction in a yield of 66.63% with respect to the weight of the starting material. The fraction was analyzed by gas chromatography to found that it was bis(ethylcyclopentadienyl)ruthenium having a purity of 99.56%.

Additionally, the purity of a ruthenium thin film produced in the process was analyzed and was found to be 98%. As a morphological analysis, surface roughness of the thin film was determined with an AFM (atomic force microscope) to find that Rms is 1.0 nm. Separately, bis(ethylcyclopentadienyl)ruthenium recovered and purified from the exhaust gas was put back into CVD apparatus 1, and a film was formed under the same conditions, and the properties of the resulting thin film were determined. As a result, it was found that a thin film had a purity of 98% and a surface roughness Rms of 1.0 nm, and stood comparison with the case using a new organometallic compound bis(ethylcyclopentadienyl)ruthenium.

Second Embodiment

In the present embodiment, using bis(ethylcyclopentadienyl)ruthenium used in the first embodiment, an exhaust gas after the formation of a thin film was subjected to an oxygen elimination treatment, and bis(ethylcyclopentadienyl)ruthenium was then recovered and purified.

Specifically, an oxygen elimination tank filed with iron powder (registered trade mark: AGELESS) as a deoxidizer was arranged between reactor 6 and cold trap 9, and a thin film was formed under this condition, and an exhaust gas was recovered and bis(ethylcyclopentadienyl)ruthenium was purified. Conditions for the production of a thin film in the present embodiment were the same as in the first embodiment.

Figure 2:
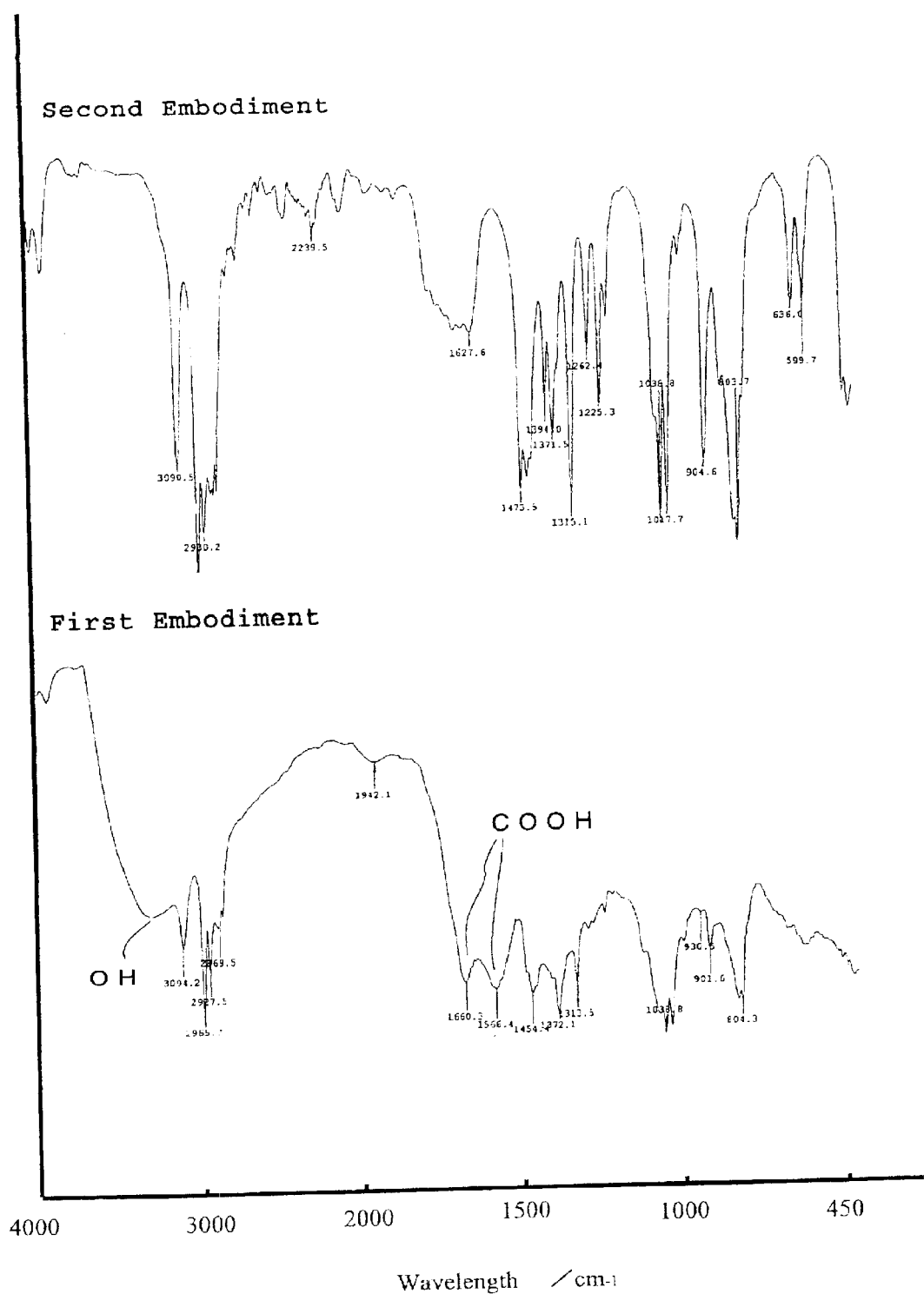
FIG. 2 is a diagram showing infrared absorption spectra of recovered contents each recovered in the first and second embodiments.

To examine whether oxidation of a recovered content is affected by elimination of oxygen on the recovered content recovered in the present embodiment, the recovered content recovered in the first embodiment and the recovered content recovered in the second embodiment were subjected to FT-IR (Fourier transformed infrared spectroscopy). The results are shown FIG. 2. FIG. 2 shows that peaks indicating OH bond and COOH bond were observed in the recovered content of the first embodiment, that is, of the case where oxygen was not eliminated from an exhaust gas from the reactor, proving that oxygen in the recovered content oxidized bis(ethylcyclopentadienyl)ruthenium. Contrary to this, these peaks were not observed in the recovered content of the second embodiment where oxygen was eliminated from the exhaust gas, verifying that oxidation of bis(ethylcyclopentadienyl)ruthenium could be prevented by an operation for eliminating oxygen.

A recovered content in the cold trap recovered in the second embodiment was 81.5 g (recovery: 81.5%). The recovered content was subjected to distillation under reduced pressure in the same manner as in the first embodiment to yield 77 g of purified bis(ethylcyclopentadienyl)ruthenium in a yield of 73.0% with a high purity of 99.6%. Accordingly, it was verified that when recovery and purification are performed after elimination of oxygen from an exhaust gas as in the present embodiment, the recovery and yield of bis(ethylcyclopentadienyl)ruthenium are improved yet to a slight extent.

Third Embodiment

In the present embodiment, 100 g of (methylcyclopentadienyl)(1,5-dimethyl-cyclooctadiene)iridium $[(C_5H_4CH_3)Ir((CH_3)_3C_8H_6)$, melting point: 40° C.] was used as an organometallic compound. A film was formed by heating (methylcyclopentadienyl)(1,5-dimethyl-cyclooctadiene)iridium to 90° C. and vaporizing the same with the same CVD apparatus as in the first embodiment.

A refrigerant was allowed to pass on a cooling surface of a cold trap to thereby cool a passing gas to about 0° C. A film was then formed until a material ran out, and a recovered content in the cold trap was collected (91 g).

The recovered content was distilled at 60° C. at 26.7 Pa (0.2 Torr) to recover 84 g of a fraction. The fraction was analyzed by gas chromatography to find that it was (methylcyclopentadienyl)(1,5-dimethyl-cyclooctadiene)iridium having a purity of 99.44%.

Subsequently, the purified (methylcyclopentadienyl)(1,5-dimethyl-cyclooctadiene)iridium was put back to CVD apparatus 1 again and a film was formed under the same conditions. As a result, a thin film of iridium could be produced at the same film forming rate as in the case where a new organometallic compound was used.

The purity and morphology (shape) of the iridium thin film obtained in the above procedure were analyzed to find that the film was equivalent to that obtained by using a new organometallic compound.

Fourth Embodiment

In the present embodiment, 100 g of (methylcyclopentadienyl)(trimethyl)platinum $[(CH_3C_5H_4)Pt(CH_3)_3$, melting point: 30° C.] was used as an organometallic compound. A film was formed using the same CVD apparatus as in the first embodiment.

Setting the temperature of a cold trap to about −30° C., a film was formed until a material ran out, and a recovered content in the trap was then collected (89 g).

The recovered content was distilled at 40° C. at 26.7 Pa (0.2 Torr) to recover 83 g of a fraction. The fraction was analyzed by gas chromatography to find that it was (methylcyclopentadienyl)(trimethyl)platinum having a purity of 99.82%.

Subsequently, the purified (methylcyclopentadienyl) (trimethyl)platinum was put back to CVD apparatus 1 again and a film was formed under the same conditions. As a result, a platinum thin film could be produced at the same film forming rate as in the case where a new organometallic compound was used. Additionally, the purity and morphology (shape) of the platinum thin film obtained in the above procedure were analyzed to find that the film was equivalent to that obtained by using a new organometallic compound.

Fifth Embodiment

Figure 3:
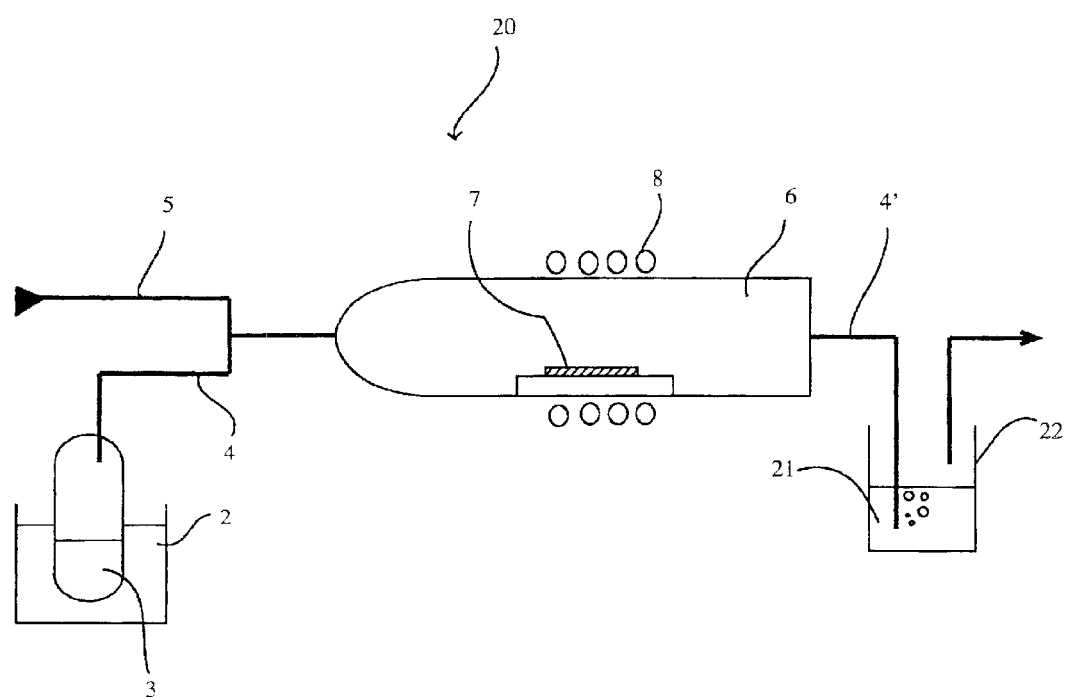
FIG. 3 is a schematic diagram of a CVD apparatus used in a fifth embodiment.

FIG. 3 shows CVD apparatus 20 used in the present embodiment. CVD apparatus 20 had the same fundamental configuration as in CVD apparatus 1, and comprised, as a recovering means instead of the cold trap, solvent tank 22 for containing xylene 21 as a solvent on the downstream side from the reaction chamber.

In the present embodiment, 100 g of bis (cyclopentadienyl)ruthenium [$(C_5H_5)_2Ru$, melting point: 199° C.] was used as organometallic compound 3. Bis (cyclopentadienyl)ruthenium was heated to 100° C. and was vaporized to form a ruthenium thin film.

The film was formed until a material ran out whereas a source gas after reaction was bubbled during the film formation to bring the source gas into contact with xylene in the solvent tank to thereby dissolve bis(cyclopentadienyl) ruthenium, and xylene was then recovered.

Methanol as a poor solvent was added to xylene in which bis(cyclopentadienyl)ruthenium was dissolved to thereby deposit and precipitate crystalline bis(cyclopentadienyl) ruthenium. The crystalline bis(cyclopentadienyl)ruthenium was separated by filtration and was taken out, and was then purified through sublimation by heating to 75° C. Ultimately, 75 g of crystalline bis(cyclopentadienyl) ruthenium was obtained. The resulting crystal was analyzed by gas chromatography to find that it was bis (cyclopentadienyl)ruthenium having a purity of 99.36%.

Subsequently, the purified bis(cyclopentadienyl) ruthenium was put back to CVD apparatus 20 again and a film was formed under the same conditions. As a result, a ruthenium thin film could be produced at the same film forming rate as in the case where a new organometallic compound was used. Additionally, the purity and morphology (shape) of the ruthenium thin film obtained in the above procedure were analyzed to find that the film was equivalent to that obtained by using a new organometallic compound.

Sixth Embodiment

In the present embodiment, an adsorption tank filled with an activated carbon was used in stead of solvent tank 22 of CVD apparatus 20. By using n-propylcyclopentadienyl (cyclopentadienyl)ruthenium [$(C_3H_7C_5H_4)(C_5H_5)Ru$, melting point: about 5° C.] as an organometallic compound, a thin film was formed and the organometallic compound was recovered.

Specifically, 100 g of n-propylcyclopentadienyl (cyclopentadienyl)ruthenium was heated to 100° C. and was vaporized to thereby form a thin film of ruthenium. In this procedure, a source gas after reaction was brought into contact with the activated carbon in the adsorption tank, and the activated carbon was recovered after the formation of a thin film. The recovered activated carbon was heated in an atmosphere at 105° C. at 46.7 Pa (0.35 Torr) to thereby desorb and vaporize n-propylcyclopentadienyl (cyclopentadienyl)ruthenium.

The vaporized n-propylcyclopentadienyl (cyclopentadienyl)ruthenium was purified and was recovered by subjecting the same to gas chromatography (filler: dimethylpolysiloxane) to yield 70 g of n-propylcyclopentadienyl(cyclopentadienyl)ruthenium having a purity of 99.56%. It was verified that a thin film equivalent to the case where a starting material was used could be produced when the thin film was produced by using the purified n-propylcyclopentadienyl(cyclopentadienyl) ruthenium purified in the present embodiment.

We claim:

1. A CVD process for forming a thin film, comprising:
   a vaporizing step of heating and vaporizing an organometallic compound to yield a source gas;
   a thin film forming step of introducing said source gas onto a substrate and allowing the source gas to react on a surface of the substrate to yield a thin film of a metal or metal oxide;
   a recovering step of cooling an exhaust gas containing a reaction product formed in said thin film forming step and an unreacted source gas to condense or solidify said unreacted source gas to thereby yield a recovered content containing a liquid or solid organometallic compound; and
   a purifying step of separating and purifying the organometallic compound from said recovered content.

2. A CVD process for forming a thin film according to claim 1, further comprising a step of eliminating oxygen from the exhaust gas prior to the recovering step.

3. A CVD process for forming a thin film according to claim 2, wherein said recovering step is performed by cooling the exhaust gas with a cold trap and wherein oxygen has been eliminated from said cold trap.

4. A CVD process for forming a thin film according to claim 3, wherein said purifying step comprises a step of distilling the recovered content to thereby separate the organometallic compound.

5. A CVD process for forming a thin film according to claim 4, wherein said purifying step comprises a step of bringing the recovered content into contact with a solvent in which the organometallic compound is soluble.

6. A CVD process for forming a thin film according to claim 5, wherein said purifying step comprises a step of eliminating oxygen from the solvent in which the organometallic compound is soluble prior to contact between the recovered content and the solvent.

7. A CVD process for forming a thin film according to claim 6, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

8. A CVD process for forming a thin film according to claim 7, wherein said purifying step further comprises a step of heating the separated solid organometallic compound to thereby sublimate one of the organometallic compound and the reaction product.

9. A CVD process for forming a thin film according to claim 5, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

10. A CVD process for forming a thin film according to claim 9, wherein said purifying step further comprises a step of heating the separated solid organometallic compound to thereby sublimate one of the organometallic compound and the reaction product.

11. A CVD process for forming a thin film according to claim 3, wherein said purifying step comprises a step of bringing the recovered content into contact with a solvent in which the organometallic compound is soluble.

12. A CVD process for forming a thin film according to claim 11, wherein said purifying step comprises a step of eliminating oxygen from the solvent in which the organometallic compound is soluble prior to contact between the recovered content and the solvent.

13. A CVD process for forming a thin film according to claim 12, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

14. A CVD process for forming a thin film according to claim 13, wherein said purifying step further comprises a step of heating the separated solid organometallic compound to thereby sublimate one of the organometallic compound and the reaction product.

15. A CVD process for forming a thin film according to claim 11, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

16. A CVD process for forming a thin film according to claim 15, wherein said purifying step further comprises a step of heating the separated solid organometallic compound to thereby sublimate one of the organometallic compound and the reaction product.

17. A CVD process for forming a thin film according to claim 2, wherein said purifying step comprises a step of distilling the recovered content to thereby separate the organometallic compound.

18. A CVD process for forming a thin film according to claim 17, wherein said purifying step comprises a step of bringing the recovered content into contact with a solvent in which the organometallic compound is soluble.

19. A CVD process for forming a thin film according to claim 18, wherein said purifying step comprises a step of eliminating oxygen from the solvent in which the organometallic compound is soluble prior to contact between the recovered content and the solvent.

20. A CVD process for forming a thin film according to claim 19, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

21. A CVD process for forming a thin film according to claim 20, wherein said purifying step further comprises a step of heating the separated solid organometallic compound to thereby sublimate one of the organometallic compound and the reaction product.

22. A CVD process for forming a thin film according to claim 18, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

23. A CVD process for forming a thin film according to claim 22, wherein said purifying step further comprises a step of heating the separated solid organometallic compound to thereby sublimate one of the organometallic compound and the reaction product.

24. A CVD process for forming a thin film according to claim 2, wherein said purifying step comprises a step of bringing the recovered content into contact with a solvent in which the organometallic compound is soluble.

25. A CVD process for forming a thin film according to claim 24, wherein said purifying step comprises a step of eliminating oxygen from the solvent in which the organometallic compound is soluble prior to contact between the recovered content and the solvent.

26. A CVD process for forming a thin film according to claim 25, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

27. A CVD process for forming a thin film according to claim 26, wherein said purifying step further comprises a step of heating the separated solid organometallic compound to thereby sublimate one of the organometallic compound and the reaction product.

28. A CVD process for forming a thin film according to claim 24, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

29. A CVD process for forming a thin film according to claim 28, wherein said purifying step further comprises a step of heating the separated solid organometallic compound to thereby sublimate one of the organometallic compound and the reaction product.

30. A CVD process for forming a thin film according to claim 1, wherein said recovering step is performed by cooling the exhaust gas with a cold trap and wherein oxygen has been eliminated from said cold trap.

31. A CVD process for forming a thin film according to claim 30, wherein said purifying step comprises a step of distilling the recovered content to thereby separate the organometallic compound.

32. A CVD process for forming a thin film according to claim 31, wherein said purifying step comprises a step of bringing the recovered content into contact with a solvent in which the organometallic compound is soluble.

33. A CVD process for forming a thin film according to claim 32, wherein said purifying step comprises a step of eliminating oxygen from the solvent in which the organometallic compound is soluble prior to contact between the recovered content and the solvent.

34. A CVD process for forming a thin film according to claim 33, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

35. A CVD process for forming a thin film according to claim 34, wherein said purifying step further comprises a step of heating the separated solid organometallic compound to thereby sublimate one of the organometallic compound and the reaction product.

36. A CVD process for forming a thin film according to claim 32, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

37. A CVD process for forming a thin film according to claim 36, wherein said purifying step further comprises a step of heating the separated solid organometallic compound to thereby sublimate one of the organometallic compound and the reaction product.

38. A CVD process for forming a thin film according to claim 30, wherein said purifying step comprises a step of bringing the recovered content into contact with a solvent in which the organometallic compound is soluble.

39. A CVD process for forming a thin film according to claim 38, wherein said purifying step comprises a step of eliminating oxygen from the solvent in which the organometallic compound is soluble prior to contact between the recovered content and the solvent.

40. A CVD process for forming a thin film according to claim 39, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

41. A CVD process for forming a thin film according to claim 40, wherein said purifying step further comprises a step of heating the separated solid organometallic compound to thereby sublimate one of the organometallic compound and the reaction product.

42. A CVD process for forming a thin film according to claim 38, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

43. A CVD process for forming a thin film according to claim 42, wherein said purifying step further comprises a step of heating the separated solid organometallic compound to thereby sublimate one of the organometallic compound and the reaction product.

44. A CVD process for forming a thin film according to claim 1, wherein said purifying step comprises a step of distilling the recovered content to thereby separate the organometallic compound.

45. A CVD process for forming a thin film according to claim 44, wherein said purifying step comprises a step of bringing the recovered content into contact with a solvent in which the organometallic compound is soluble.

46. A CVD process for forming a thin film according to claim 45, wherein said purifying step comprises a step of eliminating oxygen from the solvent in which the organometallic compound is soluble prior to contact between the recovered content and the solvent.

47. A CVD process for forming a thin film according to claim 46, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

48. A CVD process for forming a thin film according to claim 47, wherein said purifying step further comprises a step of heating the separated solid organometallic compound to thereby sublimate one of the organometallic compound and the reaction product.

49. A CVD process for forming a thin film according to claim 45, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

50. A CVD process for forming a thin film according to claim 49, wherein said purifying step further comprises a step of heating the separated solid organometallic compound to thereby sublimate one of the organometallic compound and the reaction product.

51. A CVD process for forming a thin film according to claim 1, wherein said purifying step comprises a step of bringing the recovered content into contact with a solvent in which the organometallic compound is soluble.

52. A CVD process for forming a thin film according to claim 51, wherein said purifying step comprises a step of eliminating oxygen from the solvent in which the organometallic compound is soluble prior to contact between the recovered content and the solvent.

53. A CVD process for forming a thin film according to claim 52, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

54. A CVD process for forming a thin film according to claim 53, wherein said purifying step further comprises a step of heating the separated solid organometallic compound to thereby sublimate one of the organometallic compound and the reaction product.

55. A CVD process for forming a thin film according to claim 51, wherein said purifying step comprises one of a step of cooling a solvent containing the recovered content to thereby separate the organometallic compound in a solid state, and a step of mixing a solvent containing the recovered content with a poor solvent to thereby separate the organometallic compound in a solid state, the organometallic compound being sparingly soluble in said poor solvent.

56. A CVD process for forming a thin film according to claim 55, wherein said purifying step further comprises a step of heating the separated solid organometallic compound to thereby sublimate one of the organometallic compound and the reaction product.

57. A CVD process according to claim 1, wherein the organometallic compound is of a metal selected from the group consisting of copper, indium, tantalum, tungsten, molybdenum, titanium, and rhenium.

58. A CVD process according to claim 1, wherein the organometallic compound is of a metal selected from the group consisting of silver, gold, platinum, urthenium, rhodium, indium or osminum.

* * * * *